(12) United States Patent
Doi

(10) Patent No.: US 12,032,888 B2
(45) Date of Patent: Jul. 9, 2024

(54) BATCHED QUANTUM CIRCUITS SIMULATION ON A GRAPHICS PROCESSING UNIT

(71) Applicant: International Business Machines Corporation, Armonk, NY (US)

(72) Inventor: Jun Doi, Kanagawa-ken (JP)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 729 days.

(21) Appl. No.: 17/197,647

(22) Filed: Mar. 10, 2021

(65) Prior Publication Data

US 2022/0292243 A1   Sep. 15, 2022

(51) Int. Cl.
*G06F 30/3308* (2020.01)
*G06N 10/00* (2022.01)
*G06F 30/343* (2020.01)

(52) U.S. Cl.
CPC ......... *G06F 30/3308* (2020.01); *G06N 10/00* (2019.01); *G06F 30/343* (2020.01)

(58) Field of Classification Search
CPC .... G06F 30/3308; G06F 30/343; G06N 10/00
USPC ......................................................... 703/15
See application file for complete search history.

(56) References Cited

U.S. PATENT DOCUMENTS

| | | | |
|---|---|---|---|
| 9,881,256 B2 | 1/2018 | Hamze et al. | |
| 9,984,333 B2 | 5/2018 | Biamonte et al. | |
| 10,621,140 B2 | 4/2020 | Raymond | |
| 2014/0026108 A1* | 1/2014 | Bocharov | G06N 10/00 716/102 |
| 2019/0340532 A1 | 11/2019 | Ducore et al. | |
| 2020/0210876 A1 | 7/2020 | Rolfe et al. | |

FOREIGN PATENT DOCUMENTS

| | | |
|---|---|---|
| CN | 102385668 | 3/2012 |
| CN | 108334952 | 7/2018 |

OTHER PUBLICATIONS

Haidar et al. "Batched matrix computations on hardware accelerators based on GPUs", 2015, Sage Publications, The International Journal of High Performance Computing Applications vol. 29(2), pp. 193-208 (Year: 2015).*

(Continued)

*Primary Examiner* — Brian S Cook
(74) *Attorney, Agent, or Firm* — Amin, Turocy & Watson, LLP

(57) ABSTRACT

Systems, computer-implemented methods, and computer program products to facilitate batched quantum circuits simulation on a graphics processing unit are provided. According to an embodiment, a system can comprise a first processor that executes computer executable components stored in memory. The computer executable components can comprise a generalization component that generates a first defined matrix representation of a qubit gate and that employs a control mask to generate a second defined matrix representation of a multi-qubit gate. The computer executable components can further comprise an execution component that executes a kernel overhead operation using the first defined matrix representation and the second defined matrix representation to generate a batched kernel.

20 Claims, 14 Drawing Sheets

(56) References Cited

OTHER PUBLICATIONS

Cecka, "Pro Tip: cuBLAS Strided Batched Matrix Multiply," https://developer.nvidia.com/blog/cublas-strided-batched-matrix-multiply/, 2017, 9 pages.

Tomov et al., "High-Performance Batched Computations for GPUs: Approaches and Applications," GTC, 2016, 47 pages.

Mell et al., "The NIST Definition of Cloud Computing," Recommendations of the National Institute of Standards and Technology, NIST Special Publication 800-145, Sep. 2011, 7 pages.

* cited by examiner

2x2 complex matrix   Pairs of 2 amplitudes where t is a target qubit of gate

| $m_0$ | $m_1$ |   | q[0] | q[1] | q[2] | q[3] | ... |
|---|---|---|---|---|---|---|---|
| $m_2$ | $m_3$ | × | q[2$^t$] | q[1+2$^t$] | q[2+2$^t$] | q[3+2$^t$] | |

Example of control bit = 1, cmask is set to 10b (=2),
only amplitudes whose indices AND 10b = 10b are multiplied

| $m_0$ | $m_1$ |   | q[0] | q[1] | q[2] | q[3] | ... |
|---|---|---|---|---|---|---|---|
| $m_2$ | $m_3$ | × | q[2$^t$] | q[1+2$^t$] | q[2+2$^t$] | q[3+2$^t$] | | when cmask is set to 0b, all the amplitudes are multiplied

FIG. 5

Pseudo code of batch kernel

```
loop i = 0 to N*2^(q-1)
   ishot = i / (2^(max_qubits - 1))

pair_offset = 2^target_qubit[ishot]
   swap_offset = 2^second_target_qubit[ishot]

i_local = i - (ishot * (2^(max_qubits - 1)))
   t = i_local AND (pair_offset - 1)
   index = (i_local - t)*2
   index = index + t if index AND cmask[ishot] = cmask[ishot] then
     vec0 = statevector[ishot]
     vec1 = vec0 + pair_offset - swap_offset
     mat = matrix2x2[ishot]

m0 = mat[0]
     m1 = mat[1]
     m2 = mat[2]
     m3 = mat[3]

q0 = vec0[index]
     q1 = vec1[index]

vec0[index] = m0 * q0 + m1 * q1
     vec1[index] = m2 * q0 + m3 * q1
```

FIG. 7

Parameter setting of gates

U3 gate

$$\begin{pmatrix} m_0 & m_1 \\ m_2 & m_3 \end{pmatrix}$$ Using 2x2 matrix as is cmask = 0

U1 gate

$$\begin{pmatrix} m_0 & 0 \\ 0 & m_1 \end{pmatrix}$$ Set diagonal elements cmask = 0

X gate

$$\begin{pmatrix} 0 & 1 \\ 1 & 0 \end{pmatrix}$$

cmask = 0

Y gate

$$\begin{pmatrix} 0 & -i \\ i & 0 \end{pmatrix}$$

cmask = 0

CX gate    CY gate

$$\begin{pmatrix} 0 & 1 \\ 1 & 0 \end{pmatrix} \quad \begin{pmatrix} 0 & -i \\ i & 0 \end{pmatrix}$$

cmask = 0
do c = control bits
 cmask = cmask | (2^c)

swap gate

$$\begin{pmatrix} 0 & 1 \\ 1 & 0 \end{pmatrix}$$

cmask = 2 ^ second_target_qubit
(where second_target_qubit < target_qubit)

FIG. 8

Batched measure

Calculate square of each probability amplitudes and reorder into 2 parts

Amplitudes whose *indices*
AND (2^target_qubit) = 0

| $|q[0]|^2$ | $|q[1]|^2$ | $|q[2]|^2$ | $|q[3]|^2$ | ... |

Amplitudes whose *indices*
AND (2^target_qubit) = non-zero

| $|q[2]|^2$ | $|q[1*2]|^2$ | $|q[2*2]|^2$ | $|q[3*2]|^2$ | ... |

At the same time, set key values for each amplitudes, the squared amplitudes will be accumulated whose key values are the same. Here by setting unique key value to each shot, amplitudes for multi-shots can be accumulated independently

| shot*2 | shot*2 | shot*2 | shot*2 | ... |

| shot*2+1 | shot*2+1 | shot*2+1 | shot*2+1 | ... |

Then by applying reduce by key algorithm (e.g., thrust::reduce_by_key function in Thrust library for GPU), 2 reduced values are accumulated for each shot at once

Pseudo code of multi-shot simulation

```
Do while some of shots are simulating
  do ishot = 1 to Nshot
    if current_gate[ishot] is "measure"
      enqueue shot to batched measure queue
  execute batched measure do ishot = 1 to Nshot
    if current_gate[ishot] is "measure"
      enqueue "reset" to batched kernel queue
    else
      enqueue next_gate[ishot] to batched kernel queue
    advance gate[ishot]
  execute batched kernel
```

Do batched measure first because reset gate will be called using measured value

FIG. 9

BATCHED QUANTUM CIRCUITS SIMULATION ON A GRAPHICS PROCESSING UNIT

BACKGROUND

The subject disclosure relates to quantum circuit simulation, and more specifically, to batched quantum circuits simulation on a graphics processing unit.

SUMMARY

The following presents a summary to provide a basic understanding of one or more embodiments of the invention. This summary is not intended to identify key or critical elements, or delineate any scope of the particular embodiments or any scope of the claims. Its sole purpose is to present concepts in a simplified form as a prelude to the more detailed description that is presented later. In one or more embodiments described herein, systems, devices, computer-implemented methods, and/or computer program products that can facilitate batched quantum circuits simulation on a graphics processing unit are described.

According to an embodiment, a system can comprise a first processor that executes computer executable components stored in memory. The computer executable components can comprise a generalization component that generates a first defined matrix representation of a qubit gate and that employs a control mask to generate a second defined matrix representation of a multi-qubit gate. The computer executable components can further comprise an execution component that executes a kernel overhead operation using the first defined matrix representation and the second defined matrix representation to generate a batched kernel.

According to another embodiment, a computer-implemented method can comprise generating, by a system operatively coupled to a first processor, a first defined matrix representation of a qubit gate. The computer-implemented method can further comprise employing, by the system, a control mask to generate a second defined matrix representation of a multi-qubit gate. The computer-implemented method can further comprise executing, by the system, a kernel overhead operation using the first defined matrix representation and the second defined matrix representation to generate a batched kernel.

According to another embodiment, a computer program product comprising a computer readable storage medium having program instructions embodied therewith, the program instructions executable by a first processor to cause the first processor to generate a first defined matrix representation of a qubit gate. The program instructions are further executable by the first processor to cause the first processor to employ a control mask to generate a second defined matrix representation of a multi-qubit gate. The program instructions are further executable by the first processor to cause the first processor to execute a kernel overhead operation using the first defined matrix representation and the second defined matrix representation to generate a batched kernel.

DESCRIPTION OF THE DRAWINGS

FIGS. 3, 4, 5, 6, 7, 8, and 9 illustrate example, non-limiting diagrams that can facilitate batched quantum circuits simulation on a graphics processing unit in accordance with one or more embodiments described herein.

DETAILED DESCRIPTION

Figure 1:
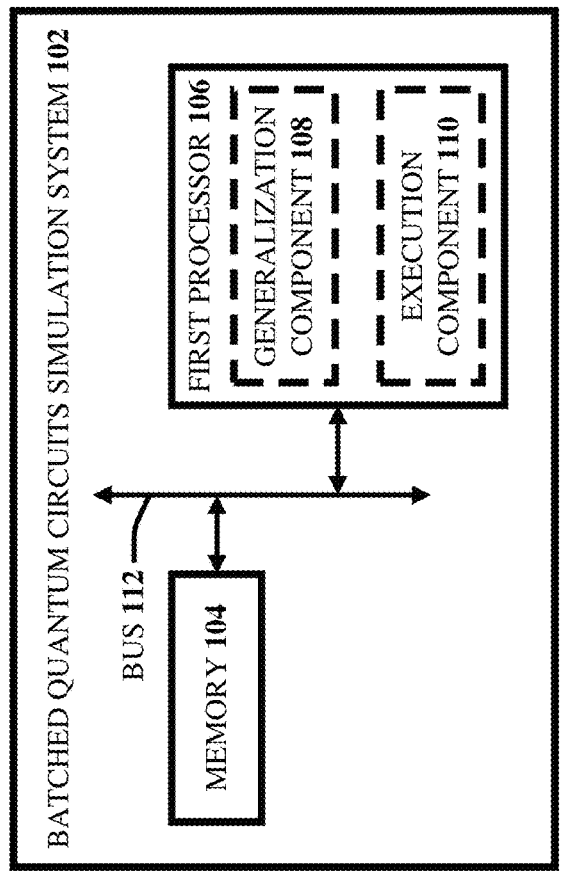
FIGS. 1 and 2 illustrate block diagrams of example, non-limiting systems that can each facilitate batched quantum circuits simulation on a graphics processing unit in accordance with one or more embodiments described herein.

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details.

As referenced herein, an "entity" can comprise a human, a client, a user, a computing device, a software application, an agent, a machine learning (ML) model, an artificial intelligence (AI), and/or another entity. It will be understood that when a component and/or an element is referred to herein as being "coupled" to another component and/or element, respectively, it can describe one or more different types of coupling including, but not limited to, communicative coupling, electrical coupling, operative coupling, optical coupling, physical coupling, and/or another type of coupling. As referenced herein, the terms below can be defined as follows.

"Quantum Computing Simulator" is a simulator that can be used to develop hardware and software that facilitates quantum computing on a classical computer.

"Statevector" is a storage of probability amplitudes that requires $2^{nq}$ complex numbers on a classical computer ($16*2^{nq}$ bytes).

"Shot" is a session of simulation of a quantum circuit comprising a sequence of quantum gates to be applied to statevector in order.

"Kernel" is a program running on, for instance, a graphics processing unit (GPU). On a GPU, a kernel can do computations parallelly with large number of threads.

"Kernel Overheads" are loads on a central processing unit (CPU), preparations, and kernel launch overheads.

Quantum computing is generally the use of quantum-mechanical phenomena for the purpose of performing computing and information processing functions. Quantum computing can be viewed in contrast to classical computing, which generally operates on binary values with transistors. That is, while classical computers can operate on bit values that are either 0 or 1, quantum computers operate on quantum bits (qubits) that comprise superpositions of both 0 and 1, can entangle multiple quantum bits, and use interference.

A GPU highly accelerates qubit gate simulation, so the simulation time can be very small for small qubits. In a result, kernel overheads will be relatively larger and dominant for the simulation time, and this problem prevents acceleration of small qubits circuits simulation.

When simulating multiple shots in parallel, each gate can be simulated independently. However, this involves kernel overheads for each shot to run on a GPU independently. The problem here is how to simulate multiple shots in a single kernel while paying only one kernel overhead. The difficulty here is that a GPU can only do the same type of calculation in a kernel at the same time.

In most cases, multiple shots are taken for a quantum circuit or multiple circuits to accumulate and analyze probabilities in noisy environments. Each of such shots can be simulated independently to achieve a linear speedup by using parallel computational power as described herein in accordance with one or more embodiments of the subject disclosure.

A GPU has larger parallelism than that of CPU cores. This unbalance tends to be a problem to get ideal speedup on a GPU. Even when the number of qubits is small, a larger number of multiple shots are involved to utilize computational capacity of a GPU and the kernel overheads are a bottleneck that are loaded on CPU cores that prevent an increase of the number of shots running at the same time.

As described below in accordance with one or more embodiments of the subject disclosure, kernel overheads can be decreased by packing multiple gates from multiple shots into a single kernel to launch at once. To do so, in accordance with one or more embodiments of the subject disclosure, quantum gates can be generalized such that each shot is calculated by the same operations in a single GPU kernel. As described below, most quantum gates can be simulated in accordance with one or more embodiments of the subject disclosure by multiplying a 2×2 complex matrix to pairs of probability amplitudes, but multi-qubit gates (e.g., a CX gate) multiplies a 4×4 matrix. To generalize gates in a single kernel, one or more of the embodiments described herein can facilitate simulation of multi-qubit gates by multiplying a 2×2 matrix.

Figure 2:
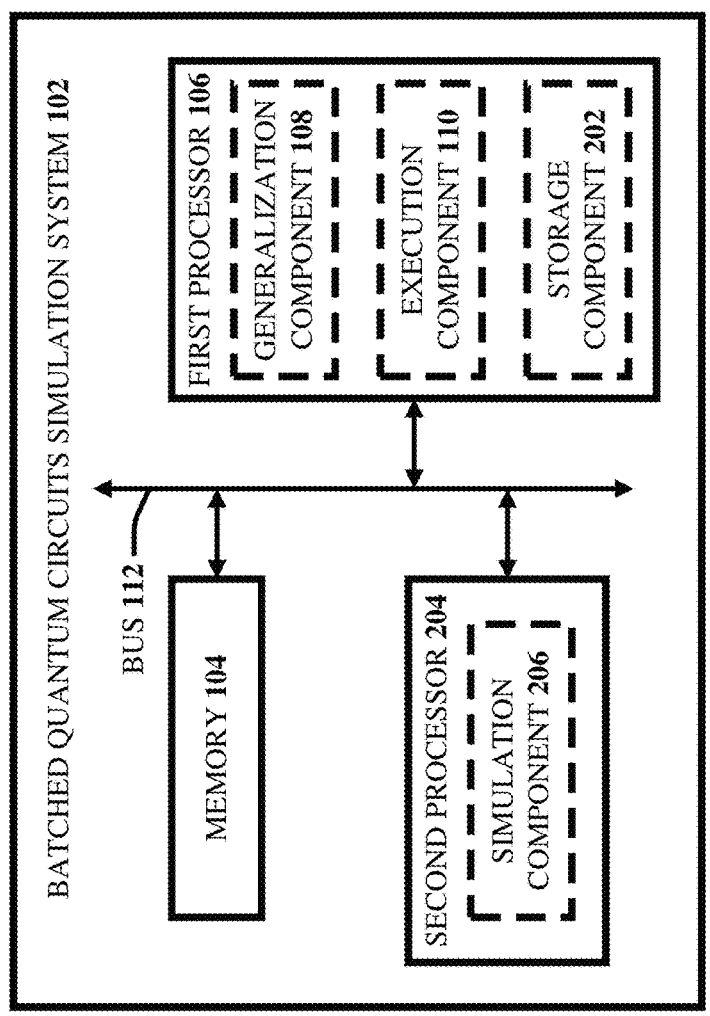

FIGS. 1 and 2 illustrate block diagrams of example, non-limiting systems 100 and 200, respectively, that can each facilitate batched quantum circuits simulation using, e.g., a computer processor and a graphics processing unit in accordance with one or more embodiments described herein. System 100 and 200 can each comprise a batched quantum circuits simulation system 102. Batched quantum circuits simulation system 102 of system 100 depicted in FIG. 1 can comprise a memory 104, a first processor 106, a generalization component 108, an execution component 110, and a bus 112. As illustrated in the example embodiment depicted in FIG. 1, first processor 106 can facilitate execution of one or more operations performed by generalization component 108 and/or execution component 110 in accordance with one or more embodiments of the subject disclosure. Batched quantum circuits simulation system 102 of system 200 depicted in FIG. 2 can further comprise a storage component 202, a second processor 204 (e.g., a GPU), and a simulation component 206. As illustrated in the example embodiment depicted in FIG. 2, first processor 106 can further facilitate execution of one or more operations performed by storage component 202 in accordance with one or more embodiments of the subject disclosure and second processor 204 can facilitate execution of one or more operations performed by simulation component 206 in accordance with one or more embodiments of the subject disclosure.

It should be appreciated that the embodiments of the subject disclosure depicted in various figures disclosed herein are for illustration only, and as such, the architecture of such embodiments are not limited to the systems, devices, and/or components depicted therein. For example, in some embodiments, system 100, system 200, and/or batched quantum circuits simulation system 102 can further comprise various computer and/or computing-based elements described herein with reference to operating environment 1200 and FIG. 12. In several embodiments, such computer and/or computing-based elements can be used in connection with implementing one or more of the systems, devices, components, and/or computer-implemented operations shown and described in connection with FIG. 1, FIG. 2, and/or other figures disclosed herein.

Memory 104 can store one or more computer and/or machine readable, writable, and/or executable components and/or instructions that, when executed by first processor 106 and/or second processor 206 (e.g., a classical processor, a GPU, a quantum processor, and/or another type of processor), can facilitate performance of operations defined by the executable component(s) and/or instruction(s). For example, memory 104 can store computer and/or machine readable, writable, and/or executable components and/or instructions that, when executed by first processor 106 and/or second processor 204, can facilitate execution of the various functions described herein relating to batched quantum circuits simulation system 102, generalization component 108, execution component 110, storage component 202, simulation component 206, and/or another component associated with batched quantum circuits simulation system 102 as described herein with or without reference to the various figures of the subject disclosure.

Memory 104 can comprise volatile memory (e.g., random access memory (RAM), static RAM (SRAM), dynamic RAM (DRAM), and/or another type of volatile memory) and/or non-volatile memory (e.g., read only memory (ROM), programmable ROM (PROM), electrically programmable ROM (EPROM), electrically erasable programmable ROM (EEPROM), and/or another type of non-volatile memory) that can employ one or more memory architectures. Further examples of memory 104 are described below with reference to system memory 1216 and FIG. 12. Such examples of memory 104 can be employed to implement any embodiments of the subject disclosure.

First processor 106 and/or second processor 204 can each comprise one or more types of processors and/or electronic circuitry (e.g., a classical processor, a quantum processor, and/or another type of processor and/or electronic circuitry) that can implement one or more computer and/or machine readable, writable, and/or executable components and/or instructions that can be stored on memory 104. For example, first processor 106 and/or second processor 204 can each perform various operations that can be specified by such computer and/or machine readable, writable, and/or executable components and/or instructions including, but not limited to, logic, control, input/output (I/O), arithmetic, and/or the like. In some embodiments, first processor 106 can comprise one or more central processing unit, multi-core processor, microprocessor, dual microprocessors, microcontroller, System on a Chip (SOC), array processor, vector processor, quantum processor, and/or another type of processor. In some embodiments, second processor 204 can comprise a processing unit that has a greater number of cores (e.g., at least 100 times, 500 times, or 1000 times as many cores as the first processor 106 and providing a greater capacity to perform parallel processing) and/or a larger memory bandwidth than that of first processor 106. For example, in some embodiments, second processor 204 can comprise a GPU that comprises a greater capacity to perform parallel processing (e.g., via a greater number of cores, such as, e.g., at least 100 times, 500 times, or 1000 times as many cores as the first processor 106) and/or a larger memory bandwidth than that of first processor 106. Further examples of first processor 106 and/or second processor 204 are described below with reference to processing unit 1214 and FIG. 12. Such examples of first processor 106 and/or second processor 204 can be employed to implement any embodiments of the subject disclosure.

Batched quantum circuits simulation system 102, memory 104, first processor 106, generalization component 108, execution component 110, storage component 202, second processor 204, simulation component 206, and/or another component of batched quantum circuits simulation system 102 as described herein can be communicatively, electrically, operatively, and/or optically coupled to one another via bus 112 to perform functions of system 100, system 200, batched quantum circuits simulation system 102, and/or any components coupled therewith. Bus 112 can comprise one or more memory bus, memory controller, peripheral bus, external bus, local bus, a quantum bus, and/or another type of bus that can employ various bus architectures. Further examples of bus 112 are described below with reference to system bus 1218 and FIG. 12. Such examples of bus 112 can be employed to implement any embodiments of the subject disclosure.

Batched quantum circuits simulation system 102 can comprise any type of component, machine, device, facility, apparatus, and/or instrument that comprises a processor and/or can be capable of effective and/or operative communication with a wired and/or wireless network. All such embodiments are envisioned. For example, batched quantum circuits simulation system 102 can comprise a server device, a computing device, a general-purpose computer, a special-purpose computer, a quantum computing device (e.g., a quantum computer), a tablet computing device, a handheld device, a server class computing machine and/or database, a laptop computer, a notebook computer, a desktop computer, a cell phone, a smart phone, a consumer appliance and/or instrumentation, an industrial and/or commercial device, a digital assistant, a multimedia Internet enabled phone, a multimedia players, and/or another type of device.

Batched quantum circuits simulation system 102 can be coupled (e.g., communicatively, electrically, operatively, optically, and/or coupled via another type of coupling) to one or more external systems, sources, and/or devices (e.g., classical and/or quantum computing devices, communication devices, and/or another type of external system, source, and/or device) using a wire and/or a cable. For example, batched quantum circuits simulation system 102 can be coupled (e.g., communicatively, electrically, operatively, optically, and/or coupled via another type of coupling) to one or more external systems, sources, and/or devices (e.g., classical and/or quantum computing devices, communication devices, and/or another type of external system, source, and/or device) using a data cable including, but not limited to, a High-Definition Multimedia Interface (HDMI) cable, a recommended standard (RS) 232 cable, an Ethernet cable, and/or another data cable.

In some embodiments, batched quantum circuits simulation system 102 can be coupled (e.g., communicatively, electrically, operatively, optically, and/or coupled via another type of coupling) to one or more external systems, sources, and/or devices (e.g., classical and/or quantum computing devices, communication devices, and/or another type of external system, source, and/or device) via a network. For example, such a network can comprise wired and/or wireless networks, including, but not limited to, a cellular network, a wide area network (WAN) (e.g., the Internet), a local area network (LAN), and/or another network. Batched quantum circuits simulation system 102 can communicate with one or more external systems, sources, and/or devices, for instance, computing devices using virtually any desired wired and/or wireless technology, including but not limited to: wireless fidelity (Wi-Fi), global system for mobile communications (GSM), universal mobile telecommunications system (UMTS), worldwide interoperability for microwave access (WiMAX), enhanced general packet radio service (enhanced GPRS), third generation partnership project (3GPP) long term evolution (LTE), third generation partnership project 2 (3GPP2) ultra mobile broadband (UMB), high speed packet access (HSPA), Zigbee and other 802.XX wireless technologies and/or legacy telecommunication technologies, BLUETOOTH®, Session Initiation Protocol (SIP), ZIGBEE®, RF4CE protocol, WirelessHART protocol, 6LoWPAN (IPv6 over Low power Wireless Area Networks), Z-Wave, an ANT, an ultra-wideband (UWB) standard protocol, and/or other proprietary and non-proprietary communication protocols. Therefore, in some embodiments, batched quantum circuits simulation system 102 can comprise hardware (e.g., a central processing unit (CPU), a transceiver, a decoder, quantum hardware, a quantum processor, and/or other hardware), software (e.g., a set of threads, a set of processes, software in execution, quantum pulse schedule, quantum circuit, quantum gates, and/or other software) or a combination of hardware and software that can facilitate communicating information between batched quantum circuits simulation system 102 and external systems, sources, and/or devices (e.g., computing devices, communication devices, and/or another type of external system, source, and/or device).

Batched quantum circuits simulation system 102 can comprise one or more computer and/or machine readable, writable, and/or executable components and/or instructions that, when executed by first processor 106 and/or second processor 204 (e.g., a classical processor, a GPU, a quantum processor, and/or another type of processor), can facilitate performance of operations defined by such component(s) and/or instruction(s). Further, in numerous embodiments, any component associated with batched quantum circuits simulation system 102, as described herein with or without reference to the various figures of the subject disclosure, can comprise one or more computer and/or machine readable, writable, and/or executable components and/or instructions that, when executed by first processor 106 and/or second processor 204, can facilitate performance of operations defined by such component(s) and/or instruction(s). For example, generalization component 108, execution component 110, storage component 202, simulation component 206, and/or any other component associated with batched quantum circuits simulation system 102 as disclosed herein (e.g., communicatively, electronically, operatively, and/or optically coupled with and/or employed by batched quantum circuits simulation system 102), can comprise such computer and/or machine readable, writable, and/or executable component(s) and/or instruction(s). Consequently, according to numerous embodiments, batched quantum circuits simulation system 102 and/or any components associated therewith as disclosed herein, can employ first processor 106 and/or second processor 204 to execute such computer and/or machine readable, writable, and/or executable component(s) and/or instruction(s) to facilitate performance of one or more operations described herein with reference to batched quantum circuits simulation system 102 and/or any such components associated therewith.

Batched quantum circuits simulation system 102 can facilitate (e.g., via first processor 106 and/or second processor 204) performance of operations executed by and/or associated with generalization component 108, execution component 110, storage component 202, simulation component 206, and/or another component associated with batched quantum circuits simulation system 102 as disclosed herein. For example, as described in detail below, batched quantum circuits simulation system 102 can facilitate (e.g., via first processor 106 and/or second processor 204): generating a first defined matrix representation of a qubit gate; employing a control mask to generate a second defined matrix representation of a multi-qubit gate; and/or executing a kernel overhead operation using the first defined matrix representation and the second defined matrix representation to generate a batched kernel.

In the above example, as described in detail below, batched quantum circuits simulation system 102 can facilitate (e.g., via first processor 106 and/or second processor 204): simulating, e.g., concurrently, the qubit gate and the multi-qubit gate on a second processor, the second processor having at least one of a greater number of cores or a larger memory bandwidth than the first processor, using the batched kernel and parallel processing threads. Batched quantum circuits simulation system 102 can also facilitate (e.g., via first processor 106 and/or second processor 204) simulating, e.g., concurrently, the qubit gate and the multi-qubit gate on a second processor, the second processor having at least one of a greater number of cores or a larger memory bandwidth than the first processor, using the batched kernel, a batched measure, and parallel processing threads, where the batched measure accumulates probability measurements associated with concurrent simulation of the qubit gate and the multi-qubit gate; generating at least one of the first defined matrix representation or the second defined matrix representation by multiplying a defined complex matrix by pairs of two probability amplitudes of a statevector of a shot that is indicative of an execution instance of an algorithm representing a quantum circuit. Batched quantum circuits simulation system 102 can also facilitate (e.g., via first processor 106 and/or second processor 204) generating the second defined matrix representation, where the multi-qubit gate comprises a control qubit, by multiplying a defined complex matrix by pairs of two probability amplitudes having defined criteria, and where the pairs of two probability amplitudes are of a statevector of a shot that is indicative of an execution instance of an algorithm representing a quantum circuit. Batched quantum circuits simulation system 102 can also facilitate (e.g., via first processor 106 and/or second processor 204) storing, in multiple queues, parameters to concurrently simulate the qubit gate and the multi-qubit gate on a second processor, the second processor having at least one of a greater number of cores or a larger memory bandwidth than the first processor, where the parameters are selected from a group consisting of the first defined matrix representation, the second defined matrix representation, pointers to statevectors, control masks, target qubits, and second target qubits. Batched quantum circuits simulation system 102 can also facilitate (e.g., via first processor 106 and/or second processor 204) executing the kernel overhead operation using the first defined matrix representation and the second defined matrix representation to generate the batched kernel and to reduce computational cost associated with at least one of execution of the kernel overhead operation or concurrent simulation of the qubit gate and the multi-qubit gate on a second processor, the second processor having at least one of a greater number of cores or a larger memory bandwidth than the first processor.

As described below with reference to the example embodiments illustrated in FIGS. 3-9, generalization component 108, execution component 110, storage component 202, and/or simulation component 206 can each perform one or more of the above described operations that can be facilitated by batched quantum circuits simulation system 102. In an example, generalization component 108 can generate a first defined matrix representation of a qubit gate and can further employ a control mask to generate a second defined matrix representation of a multi-qubit gate. For instance, generalization component 108 can generate at least one of the first defined matrix representation or the second defined matrix representation by multiplying a defined complex matrix by pairs of two probability amplitudes of a statevector of a shot that is indicative of an execution instance of an algorithm representing a quantum circuit. In some embodiments, the multi-qubit gate can comprise a control qubit. In these embodiments, generalization component 108 can generate the second defined matrix representation by multiplying a defined complex matrix by pairs of two probability amplitudes having defined criteria, where the pairs of two probability amplitudes are of a statevector of a shot that is indicative of an execution instance of an algorithm representing a quantum circuit.

In another example, execution component 110 can execute a kernel overhead operation using the above referenced first defined matrix representation and second defined matrix representation to generate a batched kernel. In some embodiments, execution component 110 can execute the kernel overhead operation using the first defined matrix representation and the second defined matrix representation to generate the batched kernel and to reduce computational cost associated with at least one of execution of the kernel overhead operation or concurrent simulation of the qubit gate and the multi-qubit gate on second processor 204 (e.g., a GPU), where second processor 204 can have at least one of a greater number of cores (e.g., at least 100 times, 500 times, or 1000 times as many cores as the first processor 106) or a larger memory bandwidth than that of first processor 106.

In another example, storage component 202 can cause to be stored, in multiple queues, parameters to concurrently simulate the above referenced qubit gate and/or multi-qubit gate on second processor 204 (e.g., a GPU), where second processor 204 can have at least one of a greater number of cores (e.g., at least 100 times, 500 times, or 1000 times as many cores as the first processor 106) or a larger memory bandwidth than that of first processor 106. For instance, such parameters can include, but are not limited to, the first defined matrix representation, the second defined matrix representation, pointers to statevectors, control masks, target qubits, second target qubits, and/or another parameter.

In another example, second processor 204 (e.g., a GPU) can execute simulation component 206 such that simulation component 206 concurrently simulates the above referenced qubit gate and/or multi-qubit gate using the batched kernel that can be generated by execution component 110 and parallel processing threads, where second processor 204 can have at least one of a greater number of cores (e.g., at least 100 times, 500 times, or 1000 times as many cores as the first processor 106) or a larger memory bandwidth than that of first processor 106. In some embodiments, second processor 204 (e.g., a GPU) can execute simulation component 206 such that simulation component 206 concurrently simulates the above referenced qubit gate and multi-qubit gate using the batched kernel that can be generated by execution component 110, a batched measure, and parallel processing threads. In these embodiments, the batched measure can accumulate probability measurements associated with concurrent simulation of the qubit gate and the multi-qubit gate and/or second processor 204 can have at least one of a greater number of cores (e.g., at least 100 times, 500 times, or 1000 times as many cores as the first processor 106) or a larger memory bandwidth than that of first processor 106.

Figure 3:
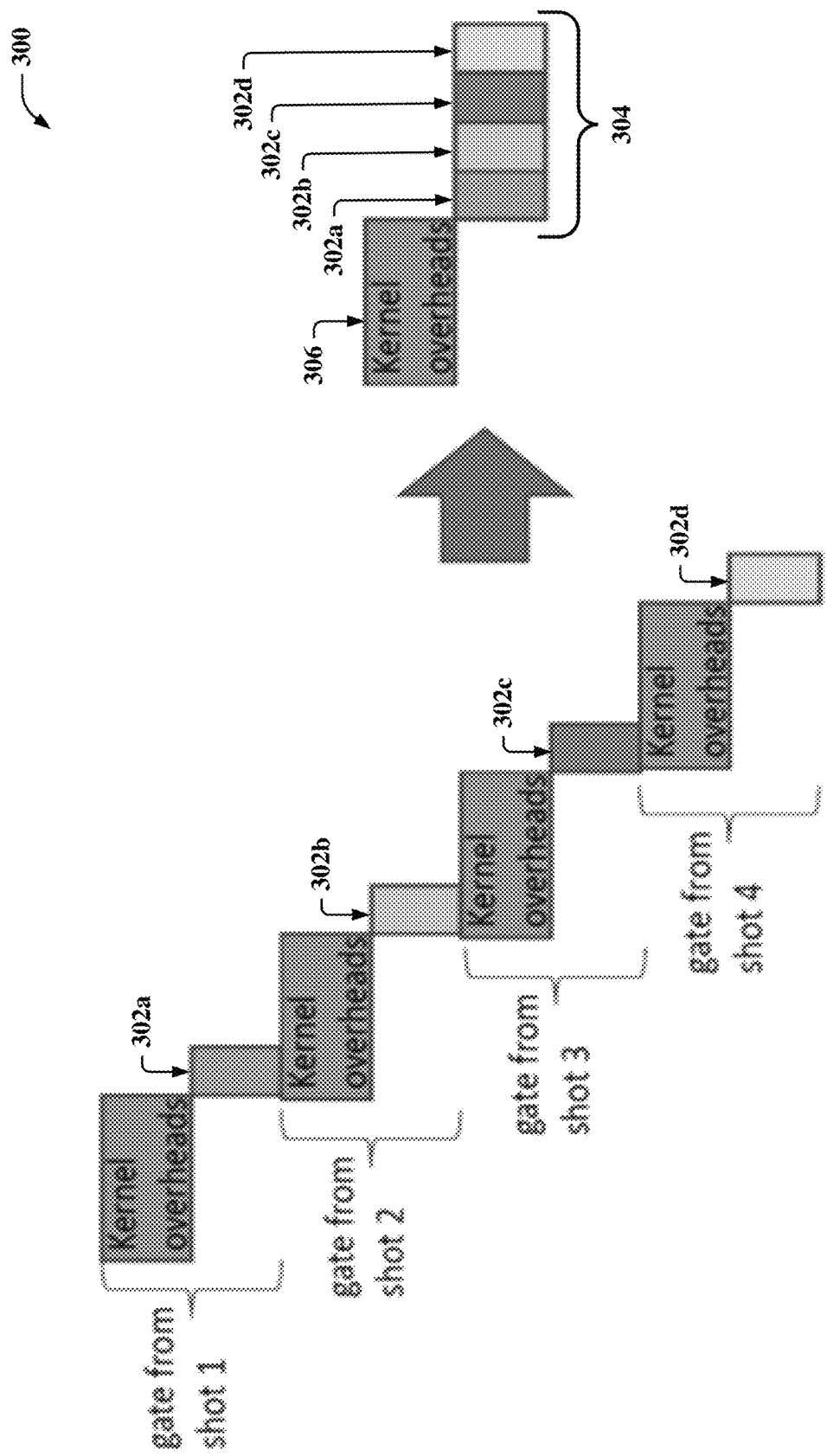

FIG. 3 illustrates an example, non-limiting diagram 300 associated with facilitating batched quantum circuits simulation on a graphics processing unit in accordance with one or more embodiments described herein. Repetitive description of like elements and/or processes employed in respective embodiments is omitted for sake of brevity.

Diagram 300 illustrates how batched quantum circuits simulation system 102 and/or one or more components thereof can batch various quantum gates of one or more shots and/or circuits to simulate such batched quantum gates in a single kernel. For example, as depicted in diagram 300, batched quantum circuits simulation system 102 and/or one or more components thereof can combine quantum gates 302a, 302b, 302c, and 302d from shots 1, 2, 3, and 4, respectively, to generate batched quantum gates 304 that can be simulated with a batched kernel 306 (denoted as "Kernel overheads" in FIG. 3). In some embodiments, quantum gates 302a, 302b, 302c, 302d can all comprise the same type of quantum gate (e.g., the same type of calculation, computation, and/or operation). In some embodiments, quantum gates 302a, 302b, 302c, 302d can each comprise a different type of quantum gate (e.g., a different type of calculation, computation, and/or operation).

Although the example embodiment illustrated in FIG. 3 depicts the batching of four quantum gates of four shots, it should be appreciated that the subject disclosure is not so limiting. For instance, batched quantum circuits simulation system 102 and/or one or more components thereof can combine more than four or less than four quantum gates from more than four or less than four shots to generate batched quantum gates 304.

Additionally, or alternatively, as kernel overheads of a GPU are relatively large to simulate a qubit circuit comprising a relatively low number of qubits, it should also be appreciated that executing a kernel overhead operation on second processor 204, which can comprise a GPU, using batched quantum gates 304 and/or batched kernel 306 can reduce computational cost associated with the execution of such a kernel overhead operation and/or computational cost associated with concurrent simulation of quantum gates 302a, 302b, 302c, 302d and/or batched quantum gates 304 on second processor 204 (e.g., a GPU). That is, for example, batched quantum circuits simulation system 102 and/or one or more components thereof can decrease kernel overheads by packing multiple quantum gates (e.g., quantum gates 302a, 302b, 302c, 302d) from multiple shots (e.g., shots 1, 2, 3, 4 illustrated in FIG. 3) into a single kernel (e.g., batched kernel 306) to launch at once (e.g., concurrently on second processor 204 (e.g., a GPU)). To do so, as described below with reference to the example embodiments illustrated in FIGS. 4-9, batched quantum circuits simulation system 102 and/or one or more components thereof can generalize such multiple quantum gates so that each shot is calculated by the same operations in a single GPU kernel (e.g., batched kernel 306).

Figure 4:
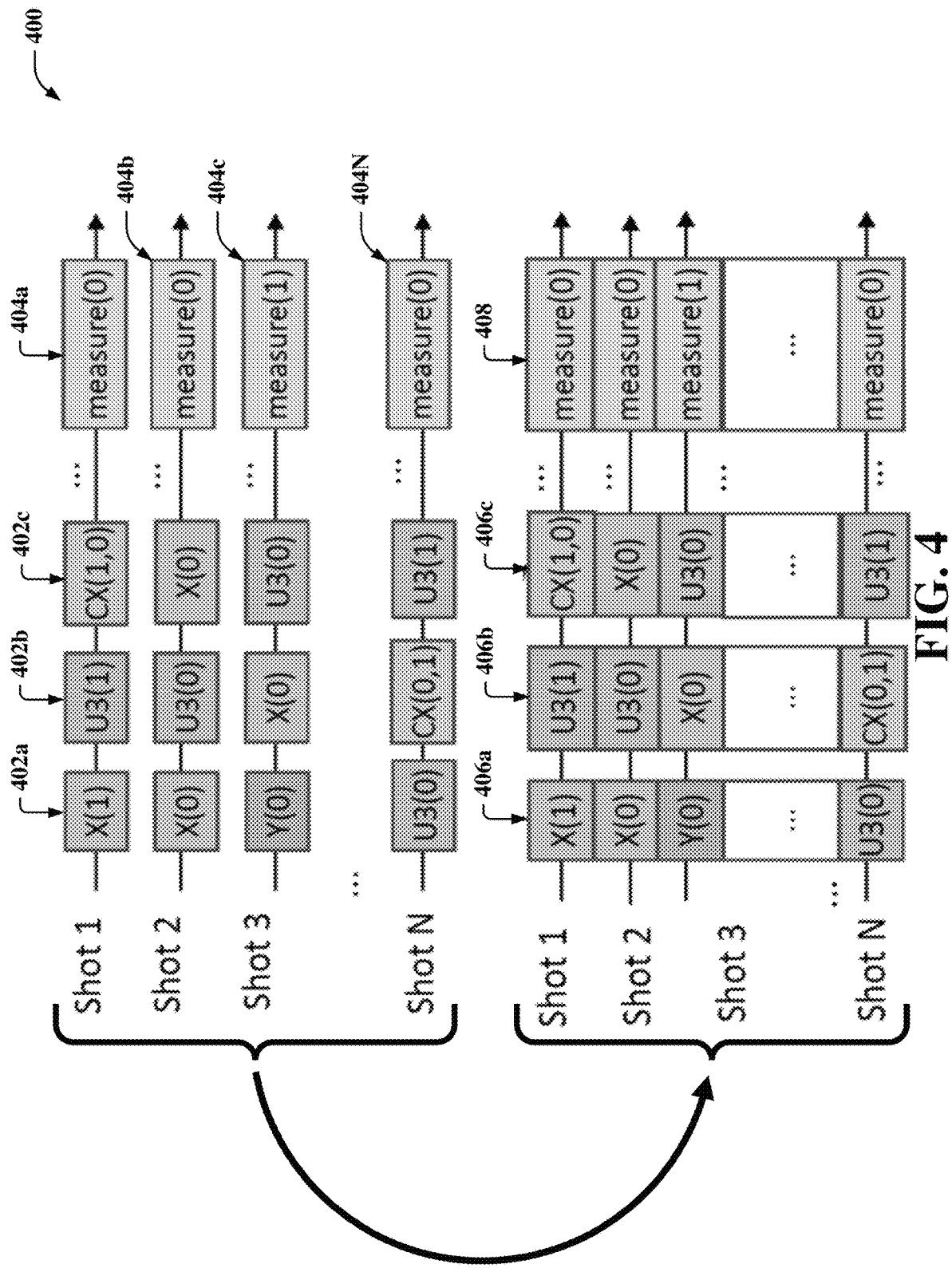

FIG. 4 illustrates an example, non-limiting diagram 400 that can facilitate batched quantum circuits simulation on a graphics processing unit in accordance with one or more embodiments described herein. Repetitive description of like elements and/or processes employed in respective embodiments is omitted for sake of brevity.

Diagram 400 illustrates how batched quantum circuits simulation system 102 and/or one or more components thereof can generate batched general quantum gate kernels 406a, 406b, 406c of shots 1, 2, 3, N (where "N" denotes a total quantity) from quantum gates 402a, 402b, 402c of shots 1, 2, 3, N. Diagram 400 further illustrates how batched quantum circuits simulation system 102 and/or one or more components thereof can generate batched measures 408 of shots 1, 2, 3, N from measures 404a, 404b, 404c, 404N of shots 1, 2, 3, N. For clarity, only quantum gates 402a, 402b, 402c are annotated in FIG. 4. In some embodiments, batched quantum circuits simulation system 102 and/or one or more components thereof (e.g., simulation component 206) can simulate all shots 1, 2, 3, N concurrently on second processor 204 (e.g., a GPU) using batched general quantum gate kernels 406a, 406b, 406c. In some embodiments, batched quantum circuits simulation system 102 and/or one or more components thereof (e.g., simulation component 206) can accumulate probabilities of each shot 1, 2, 3, N concurrently on second processor 204 (e.g., a GPU) using batched measures 408.

FIG. 5 illustrates an example, non-limiting diagram 500 that can facilitate batched quantum circuits simulation on a graphics processing unit in accordance with one or more embodiments described herein. Repetitive description of like elements and/or processes employed in respective embodiments is omitted for sake of brevity.

Diagram 500 illustrates how batched quantum circuits simulation system 102 and/or one or more components thereof can generalize quantum gates so that each shot is calculated by the same operations in the single GPU kernel. In some embodiments, batched quantum circuits simulation system 102 and/or one or more components thereof (e.g., generalization component 108, execution component 110, and/or simulation component 206) can simulate quantum gates (e.g., via second processor 204 (e.g., a GPU)) by multiplying a 2×2 complex matrix to pairs of probability amplitudes, while multi-qubit gates (e.g., a CX gate) involves multiplying a 4×4 matrix. In some embodiments, to generalize quantum gates in a single kernel, batched quantum circuits simulation system 102 and/or one or more components thereof can simulate (e.g., via second processor 204 (e.g., a GPU)) multi-qubit gates by multiplying a 2×2 matrix. In an example, general gate kernel (e.g., via batched quantum circuits simulation system 102 and/or one or more components thereof) multiplies 2×2 complex matrix to pairs of 2 probability amplitudes from the statevector of each shot. In another example, to handle control bits of multi-qubit gates, batched quantum circuits simulation system 102 and/or one or more components thereof can prepare a control mask (cmask) to take bitwise AND to the indices of statevector to test if 2×2 matrix can be multiplied.

Figure 6:
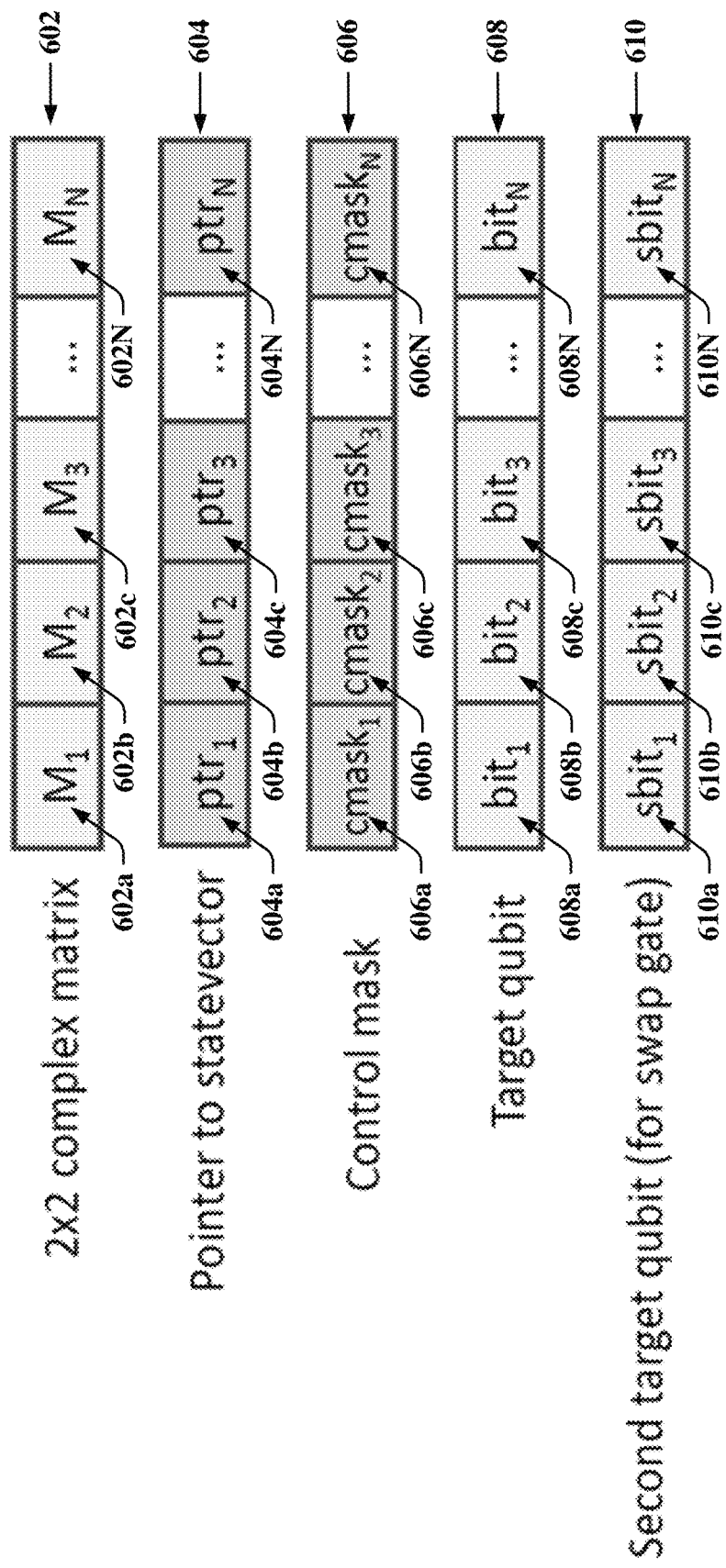

FIG. 6 illustrates an example, non-limiting diagram 600 that can facilitate batched quantum circuits simulation on a graphics processing unit in accordance with one or more embodiments described herein. Repetitive description of like elements and/or processes employed in respective embodiments is omitted for sake of brevity.

Diagram 600 illustrates how batched quantum circuits simulation system 102 and/or one or more components thereof (e.g., storage component 202) can store one or more parameters of one or more shots in one or more queues. For example, diagram 600 illustrates how storage component 202 can store parameters of the above described shots 1, 2, 3, N illustrated in FIG. 4 in different queues. As illustrated in the example embodiment depicted in FIG. 6, storage component 202 can store: 2×2 complex matrix parameters 602a, 602b, 602c, 602N of shots 1, 2, 3, N in queue 602; pointer to statevector parameters 604a, 604b, 604c, 604N in queue 604; control mask parameters 606a, 606b, 606c, 606N in queue 606; target qubit parameters 608a, 608b, 608c, 608N in queue 608; and/or second target qubit parameters 610a, 610b, 610c, 610N in queue 610.

In accordance with the above described example embodiments illustrated in FIGS. 3-6, batched quantum circuits simulation system 102 and/or one or more components thereof can implement the following multi-shot batch execution procedure to concurrently simulate shots 1, 2, 3, N on second processor 204 (e.g., a GPU):

1) generate a 2×2 matrix for each quantum gate (e.g., quantum gates 302a, 302b, 302c, 302d or quantum gates 402a, 402b, 402c);
2) set a control mask in embodiments where there is at least one control qubit;
3) store parameters in queues (e.g., as illustrated in diagram 600 of FIG. 6); and
4) execute kernel (e.g., batched kernel 306 or batched general quantum gate kernel 406a, 406b, and/or 406c) with $N*2^{q-1}$ threads on second processor 204 (e.g., a GPU), where N denotes the total number of shots, q denotes the max number of qubits of quantum circuit.

FIG. 7 illustrates an example, non-limiting diagram 700 that can facilitate batched quantum circuits simulation on a graphics processing unit in accordance with one or more embodiments described herein. Repetitive description of like elements and/or processes employed in respective embodiments is omitted for sake of brevity.

Diagram 700 comprises a pseudo code of a batch kernel that can be implemented (e.g., executed) by batched quantum circuits simulation system 102 and/or one or more components thereof to generate a batched kernel in accordance with one or more of the embodiments of the subject disclosure. In various embodiments, batched quantum circuits simulation system 102 and/or one or more components thereof can parallelize and distribute "loop i" to threads (e.g., different processing threads), where each thread can compute 1 iteration.

FIG. 8 illustrates an example, non-limiting diagram 800 that can facilitate batched quantum circuits simulation on a graphics processing unit in accordance with one or more embodiments described herein. Repetitive description of like elements and/or processes employed in respective embodiments is omitted for sake of brevity.

Diagram 800 illustrates how batched quantum circuits simulation system 102 and/or one or more components thereof can set one or more parameters of quantum gates in accordance with one or more embodiments of the subject disclosure. For instance, as illustrated in the example embodiment depicted in FIG. 8, diagram 800 shows how batched quantum circuits simulation system 102 and/or one or more components thereof can set parameters of quantum gates such as, for example, a U3 gate, a U1 gate, an X gate, a Y gate, a swap gate, a CX gate, and/or a CY gate.

FIG. 9 illustrates an example, non-limiting diagram 900 that can facilitate batched quantum circuits simulation on a graphics processing unit in accordance with one or more embodiments described herein. Repetitive description of like elements and/or processes employed in respective embodiments is omitted for sake of brevity.

Diagram 900 illustrates how batched quantum circuits simulation system 102 and/or one or more components thereof can generate one or more batched measures. For example, diagram 900 illustrates how batched quantum circuits simulation system 102 and/or one or more components thereof can generate batched measures 408 described above and illustrated in the example embodiment depicted in FIG. 4. Diagram 900 further illustrates pseudo code that can be implemented (e.g., executed) by batched quantum circuits simulation system 102 and/or one or more components thereof to perform multi-shot simulation (e.g., on second processor 204 (e.g., a GPU)) in accordance with one or more embodiments of the subject disclosure.

Figure 10:
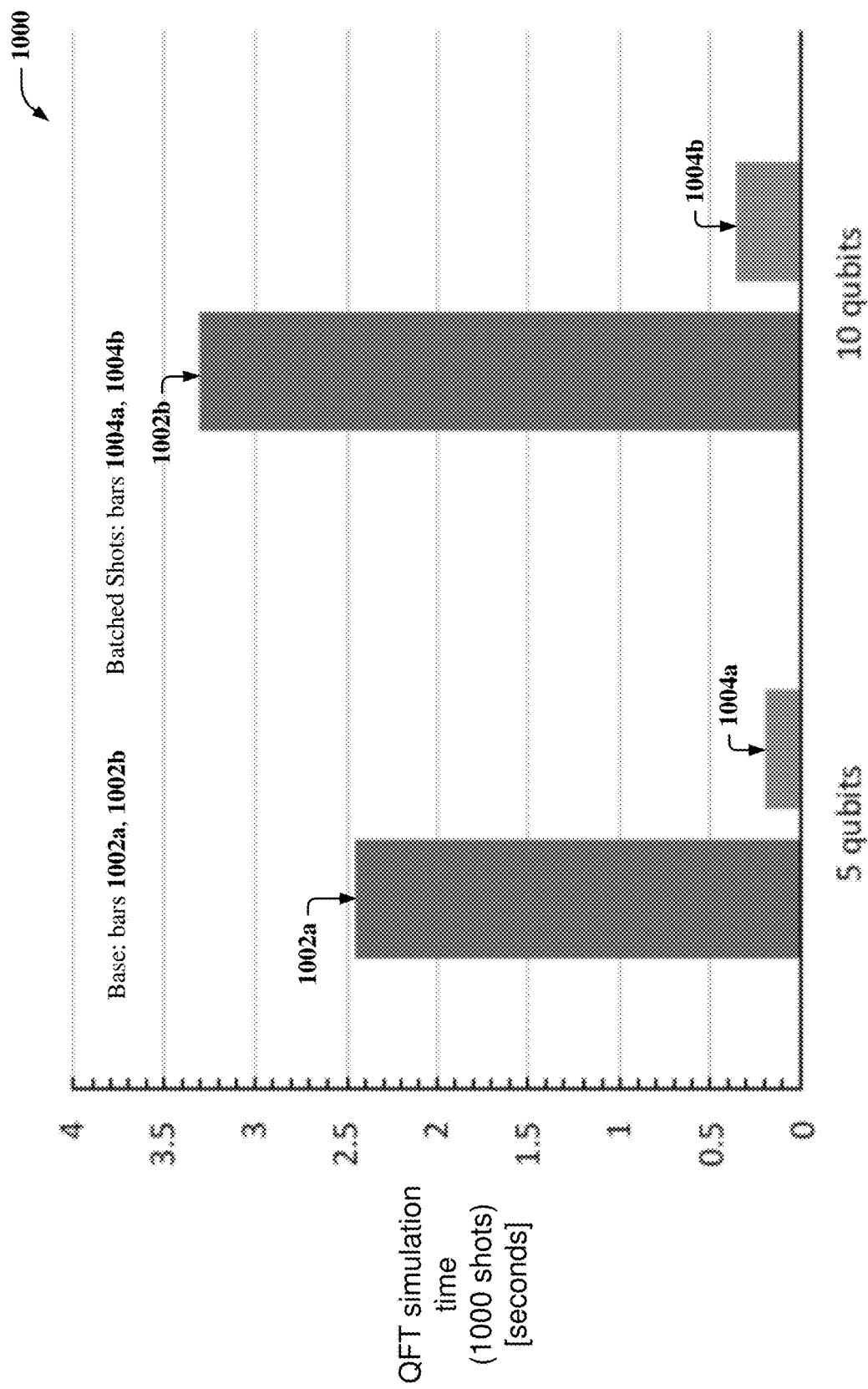
FIG. 10 illustrates an example, non-limiting graph that can facilitate batched quantum circuits simulation on a graphics processing unit in accordance with one or more embodiments described herein.

FIG. 10 illustrates an example, non-limiting graph 1000 that can facilitate batched quantum circuits simulation on a graphics processing unit in accordance with one or more embodiments described herein. Repetitive description of like elements and/or processes employed in respective embodiments is omitted for sake of brevity.

Graph 1000 illustrates experimental results from implementing batched quantum circuits simulation system 102 in accordance with one or more embodiments of the subject disclosure. That is, for instance, graph 1000 illustrates a simulation time comparison with batched multi-shot optimization (represented by bars 1004a, 1004b in FIG. 10) and without batched multi-shot optimization (represented by bars 1002a, 1002b in FIG. 10), using Quantum Fourier Transform (QFT) circuits with noise 1,000 shots for each. As illustrated by bars 1002a, 1002b, 1004a, 1004b depicted in graph 1000, simulation by batched quantum circuits simulation system 102 and/or one or more components thereof of quantum circuits comprising 5 qubits and 10 qubits using batched shots (represented by bars 1004a, 1004b in FIG. 10) in accordance with one or more embodiments of the subject disclosure can be completed in less time compared to simulation of the same circuits without using batched shots (represented by bars 1002a, 1002b in FIG. 10).

Figure 11:
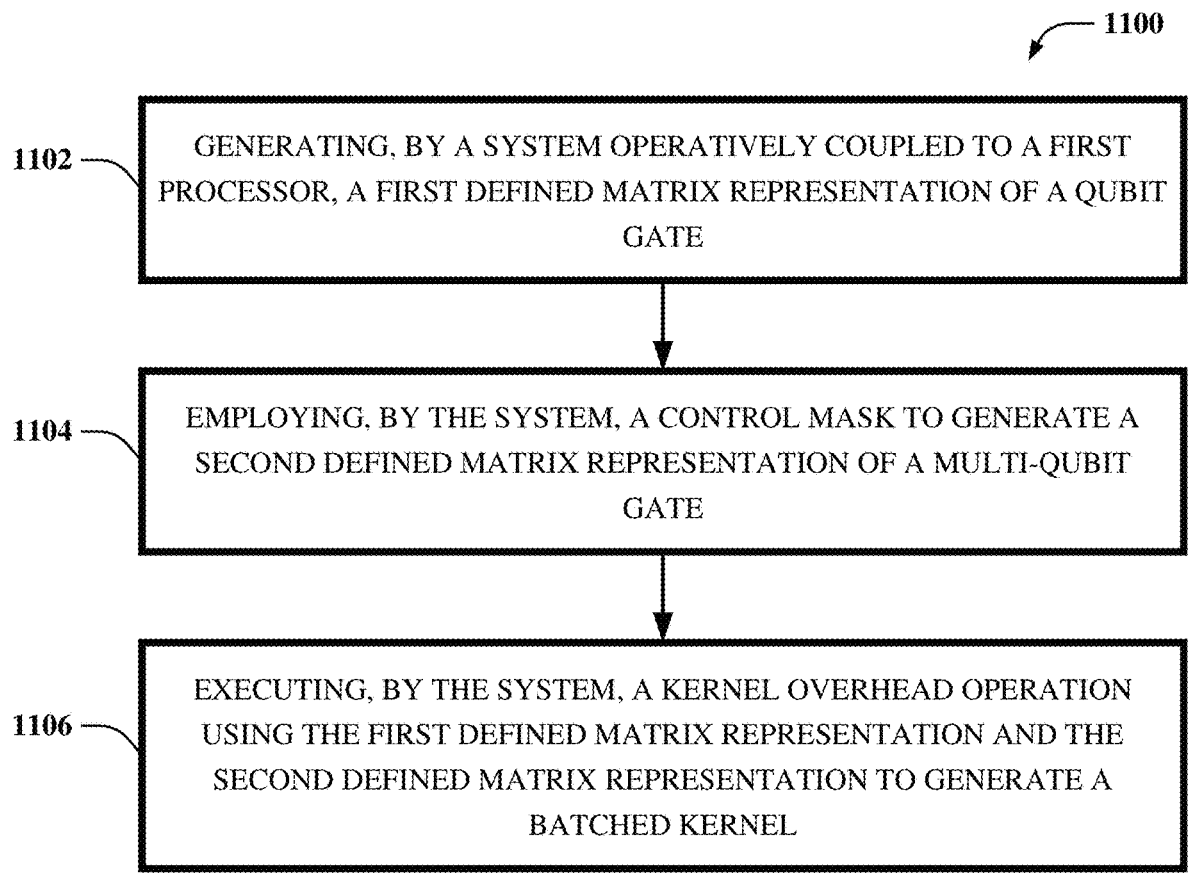
FIG. 11 illustrates a flow diagram of an example, non-limiting computer-implemented method that can facilitate batched quantum circuits simulation on a graphics processing unit in accordance with one or more embodiments described herein.

FIG. 11 illustrates a flow diagram of an example, non-limiting computer-implemented method 1100 that can facilitate batched quantum circuits simulation on a graphics processing unit in accordance with one or more embodiments described herein. Repetitive description of like elements and/or processes employed in respective embodiments is omitted for sake of brevity.

At 1102, computer-implemented method 1100 can comprise generating, by a system (e.g., via batched quantum circuits simulation system 102 and/or generalization component 108) operatively coupled to a first processor (e.g., first processor 106), a first defined matrix representation of a qubit gate.

At 1104, computer-implemented method 1100 can comprise employing, by the system (e.g., via batched quantum circuits simulation system 102 and/or generalization component 108), a control mask to generate a second defined matrix representation of a multi-qubit gate.

At 1106, computer-implemented method 1100 can comprise executing, by the system (e.g., via batched quantum circuits simulation system 102 and/or execution component 110), a kernel overhead operation using the first defined matrix representation and the second defined matrix representation to generate a batched kernel.

Batched quantum circuits simulation system 102 can be associated with various technologies. For example, batched quantum circuits simulation system 102 can be associated with quantum computing technologies, quantum circuit technologies, quantum circuit simulation technologies, quantum circuit optimization technologies, quantum hardware and/or software technologies, quantum algorithm technologies, machine learning technologies, artificial intelligence technologies, cloud computing technologies, knowledge base technologies, and/or other technologies.

Batched quantum circuits simulation system 102 can provide technical improvements to systems, devices, components, operational steps, and/or processing steps associated with the various technologies identified above. For example, as kernel overheads of a GPU are relatively large to simulate a qubit circuit comprising a relatively low number of qubits, batched quantum circuits simulation system 102 can execute a kernel overhead operation on a GPU using batched quantum gates and/or a batched kernel in accordance with one or more embodiments of the subject disclosure, which can reduce computational cost associated with executing such a kernel overhead operation and/or computational cost associated with concurrent simulation of such batched quantum gates in the qubit circuit on such a GPU. That is, for example, batched quantum circuits simulation system 102 can decrease kernel overheads by packing multiple quantum gates from multiple shots into a single kernel to launch at once (e.g., concurrently on a GPU). In these examples, it should be appreciated that batched quantum circuits simulation system 102 can thereby enable and/or contribute to the development of quantum software and/or hardware by accelerating simulation of quantum circuits comprising a relatively low number of qubits with a relatively large number of shots (e.g., Variational Quantum Eigensolver (VQE)). For instance, batched quantum circuits simulation system 102 can accelerate such simulation by approximately 10 times compared to existing simulators.

Batched quantum circuits simulation system 102 can provide technical improvements to a processing unit (e.g., first processor 106, second processor 204, a quantum processor, and/or another processor) associated with batched quantum circuits simulation system 102. For example, as described above, batched quantum circuits simulation system 102 can reduce computational cost associated with executing a kernel overhead operation and/or computational cost associated with concurrent simulation of batched quantum gates in a qubit circuit on a GPU. In this example, batched quantum circuits simulation system 102 can thereby reduce computational cost of such a GPU used to perform the simulation of the batched quantum gates and/or further improve the performance and/or efficiency of such a GPU.

A practical application of batched quantum circuits simulation system 102 is that it can be implemented to reduce computational costs associated with using a GPU to simulate a quantum circuit having relatively low number of qubits, where such a quantum circuit can be executed to compute one or more solutions (e.g., heuristic(s)) to a variety of problems ranging in complexity (e.g., an estimation problem, an optimization problem, and/or another problem) in a variety of domains (e.g., finance, chemistry, medicine, and/or another domain). For example, a practical application of batched quantum circuits simulation system 102 is that it can be implemented to reduce computational costs associated with using a GPU to simulate a quantum circuit having relatively low number of qubits that can be executed to compute one or more solutions (e.g., heuristic(s)) to an estimation problem and/or an optimization problem in the domain of chemistry, medicine, and/or finance, where such a solution can be used to engineer, for instance, a new chemical compound, a new medication, and/or a new financial derivative premium.

It should be appreciated that batched quantum circuits simulation system 102 provides a new approach driven by relatively new quantum computing technologies. For example, batched quantum circuits simulation system 102 provides a new approach to reduce computational costs associated with using a GPU to simulate a quantum circuit having relatively low number of qubits.

Batched quantum circuits simulation system 102 can employ hardware or software to solve problems that are highly technical in nature, that are not abstract and that cannot be performed as a set of mental acts by a human. In some embodiments, one or more of the processes described herein can be performed by one or more specialized computers (e.g., a specialized processing unit, a specialized classical computer, a specialized quantum computer, and/or another type of specialized computer) to execute defined tasks related to the various technologies identified above. Batched quantum circuits simulation system 102 and/or components thereof, can be employed to solve new problems that arise through advancements in technologies mentioned above, employment of quantum computing systems, cloud computing systems, computer architecture, and/or another technology.

It is to be appreciated that batched quantum circuits simulation system 102 can utilize various combinations of electrical components, mechanical components, and circuitry that cannot be replicated in the mind of a human or performed by a human, as the various operations that can be executed by batched quantum circuits simulation system 102 and/or components thereof as described herein are operations that are greater than the capability of a human mind. For instance, the amount of data processed, the speed of processing such data, or the types of data processed by batched quantum circuits simulation system 102 over a certain period of time can be greater, faster, or different than the amount, speed, or data type that can be processed by a human mind over the same period of time.

According to several embodiments, batched quantum circuits simulation system 102 can also be fully operational towards performing one or more other functions (e.g., fully powered on, fully executed, and/or another function) while also performing the various operations described herein. It should be appreciated that such simultaneous multi-operational execution is beyond the capability of a human mind. It should also be appreciated that batched quantum circuits simulation system 102 can include information that is impossible to obtain manually by an entity, such as a human user. For example, the type, amount, and/or variety of information included in batched quantum circuits simulation system 102, generalization component 108, execution component 110, storage component 202, and/or simulation component 206 can be more complex than information obtained manually by a human user.

In some embodiments, batched quantum circuits simulation system 102 can be associated with a cloud computing environment. For example, batched quantum circuits simulation system 102 can be associated with cloud computing environment 1350 described below with reference to FIG. 13 and/or one or more functional abstraction layers described below with reference to FIG. 14 (e.g., hardware and software layer 1460, virtualization layer 1470, management layer 1480, and/or workloads layer 1490).

Batched quantum circuits simulation system 102 and/or components thereof (e.g., generalization component 108, execution component 110, storage component 202, simulation component 206, and/or another component) can employ one or more computing resources of cloud computing environment 1350 described below with reference to FIG. 13 and/or one or more functional abstraction layers (e.g., quantum software) described below with reference to FIG. 14 to execute one or more operations in accordance with one or more embodiments of the subject disclosure described herein. For example, cloud computing environment 1350 and/or such one or more functional abstraction layers can comprise one or more classical computing devices (e.g., classical computer, classical processor, virtual machine, server, and/or another classical computing device), quantum hardware, and/or quantum software (e.g., quantum computing device, quantum computer, quantum processor, quantum circuit simulation software, superconducting circuit, and/or other quantum hardware and/or quantum software) that can be employed by batched quantum circuits simulation system 102 and/or components thereof to execute one or more operations in accordance with one or more embodiments of the subject disclosure described herein. For instance, batched quantum circuits simulation system 102 and/or components thereof can employ such one or more classical and/or quantum computing resources to execute one or more classical and/or quantum: mathematical function, calculation, and/or equation; computing and/or processing script, routine, and/or instruction; algorithm; model (e.g., artificial intelligence (AI) model, machine learning (ML) model, and/or another type of model); and/or another operation in accordance with one or more embodiments of the subject disclosure described herein.

It is to be understood that although this disclosure includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g., networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported, providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure that includes a network of interconnected nodes.

For simplicity of explanation, the computer-implemented methodologies are depicted and described as a series of acts. It is to be understood and appreciated that the subject innovation is not limited by the acts illustrated and/or by the order of acts, for example acts can occur in various orders and/or concurrently, and with other acts not presented and described herein. Furthermore, not all illustrated acts can be required to implement the computer-implemented methodologies in accordance with the disclosed subject matter. In addition, those skilled in the art will understand and appreciate that the computer-implemented methodologies could alternatively be represented as a series of interrelated states via a state diagram or events. Additionally, it should be further appreciated that the computer-implemented methodologies disclosed hereinafter and throughout this specification are capable of being stored on an article of manufacture to facilitate transporting and transferring such computer-implemented methodologies to computers. The term article of manufacture, as used herein, is intended to encompass a computer program accessible from any computer-readable device or storage media.

Figure 12:
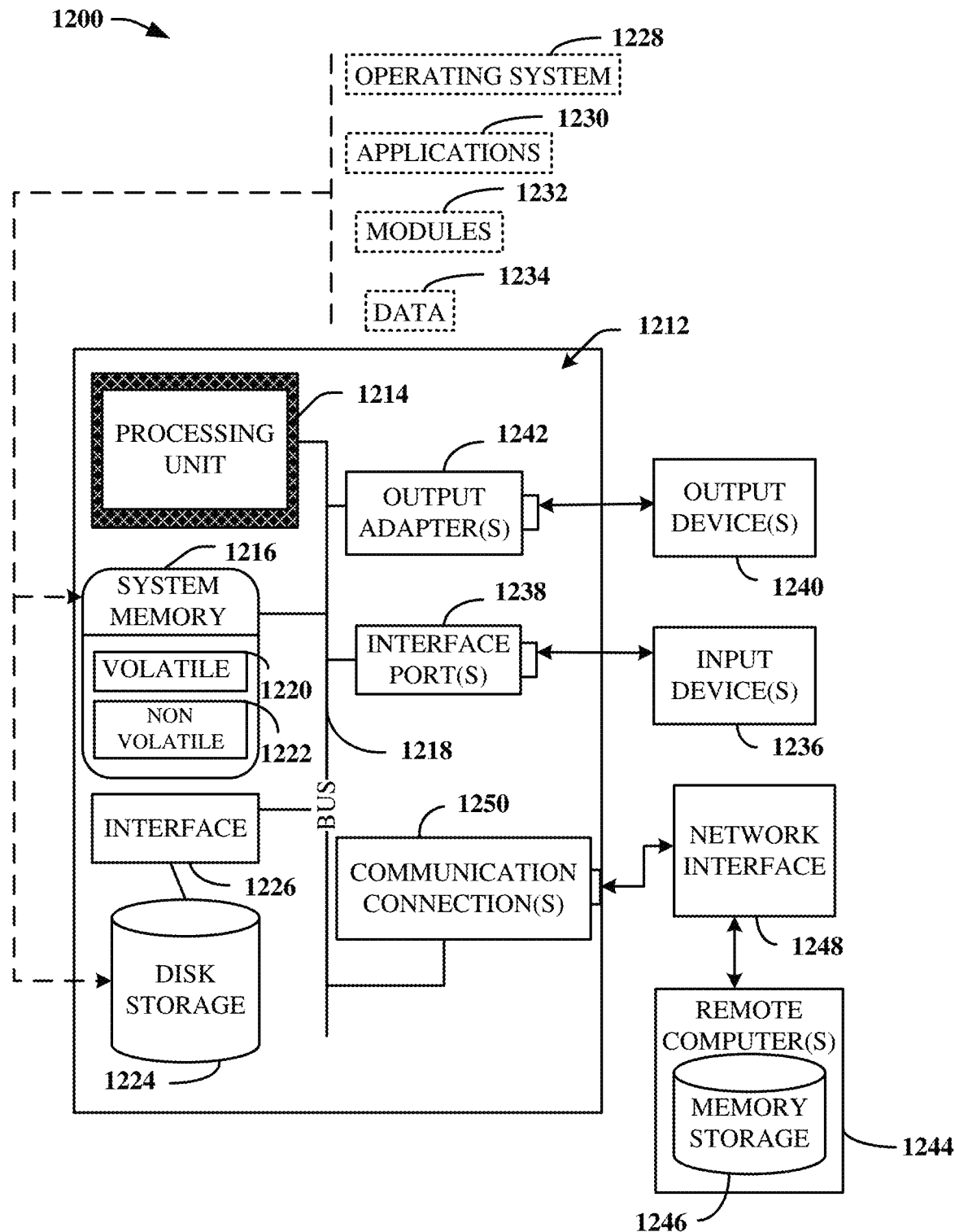
FIG. 12 illustrates a block diagram of an example, non-limiting operating environment in which one or more embodiments described herein can be facilitated.

In order to provide a context for the various aspects of the disclosed subject matter, FIG. 12 as well as the following discussion are intended to provide a general description of a suitable environment in which the various aspects of the disclosed subject matter can be implemented. FIG. 12 illustrates a block diagram of an example, non-limiting operating environment in which one or more embodiments described herein can be facilitated. Repetitive description of like elements employed in other embodiments described herein is omitted for sake of brevity.

With reference to FIG. 12, a suitable operating environment 1200 for implementing various aspects of this disclosure can also include a computer 1212. The computer 1212 can also include a processing unit 1214, a system memory 1216, and a system bus 1218. The system bus 1218 couples system components including, but not limited to, the system memory 1216 to the processing unit 1214. The processing unit 1214 can be any of various available processors. Dual microprocessors and other multiprocessor architectures also can be employed as the processing unit 1214. The system bus 1218 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Firewire (IEEE 1394), and Small Computer Systems Interface (SCSI).

The system memory 1216 can also include volatile memory 1220 and nonvolatile memory 1222. The basic input/output system (BIOS), containing the basic routines to transfer information between elements within the computer 1212, such as during start-up, is stored in nonvolatile memory 1222. Computer 1212 can also include removable/non-removable, volatile/non-volatile computer storage media. FIG. 12 illustrates, for example, a disk storage 1224. Disk storage 1224 can also include, but is not limited to, devices like a magnetic disk drive, floppy disk drive, tape drive, Jaz drive, Zip drive, LS-100 drive, flash memory card, or memory stick. The disk storage 1224 also can include storage media separately or in combination with other storage media. To facilitate connection of the disk storage 1224 to the system bus 1218, a removable or non-removable interface is typically used, such as interface 1226. FIG. 12 also depicts software that acts as an intermediary between users and the basic computer resources described in the suitable operating environment 1200. Such software can also include, for example, an operating system 1228. Operating system 1228, which can be stored on disk storage 1224, acts to control and allocate resources of the computer 1212.

System applications 1230 take advantage of the management of resources by operating system 1228 through program modules 1232 and program data 1234, e.g., stored either in system memory 1216 or on disk storage 1224. It is to be appreciated that this disclosure can be implemented with various operating systems or combinations of operating systems. A user enters commands or information into the computer 1212 through input device(s) 1236. Input devices 1236 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1214 through the system bus 1218 via interface port(s) 1238. Interface port(s) 1238 include, for example, a serial port, a parallel port, a game port, and a universal serial bus (USB). Output device(s) 1240 use some of the same type of ports as input device(s) 1236. Thus, for example, a USB port can be used to provide input to computer 1212, and to output information from computer 1212 to an output device 1240. Output adapter 1242 is provided to illustrate that there are some output devices 1240 like monitors, speakers, and printers, among other output devices 1240, which require special adapters. The output adapters 1242 include, by way of illustration and not limitation, video and sound cards that provide a means of connection between the output device 1240 and the system bus 1218. It should be noted that other devices and/or systems of devices provide both input and output capabilities such as remote computer(s) 1244.

Computer 1212 can operate in a networked environment using logical connections to one or more remote computers, such as remote computer(s) 1244. The remote computer(s) 1244 can be a computer, a server, a router, a network PC, a workstation, a microprocessor based appliance, a peer device or other common network node and the like, and typically can also include many or all of the elements described relative to computer 1212. For purposes of brevity, only a memory storage device 1246 is illustrated with remote computer(s) 1244. Remote computer(s) 1244 is logically connected to computer 1212 through a network interface 1248 and then physically connected via communication connection 1250. Network interface 1248 encompasses wire and/or wireless communication networks such as local-area networks (LAN), wide-area networks (WAN), cellular networks, and/or another wire and/or wireless communication network. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL). Communication connection(s) 1250 refers to the hardware/software employed to connect the network interface 1248 to the system bus 1218. While communication connection 1250 is shown for illustrative clarity inside computer 1212, it can also be external to computer 1212. The hardware/software for connection to the network interface 1248 can also include, for exemplary purposes only, internal and external technologies such as, modems including regular telephone grade modems, cable modems and DSL modems, ISDN adapters, and Ethernet cards.

Figure 13:
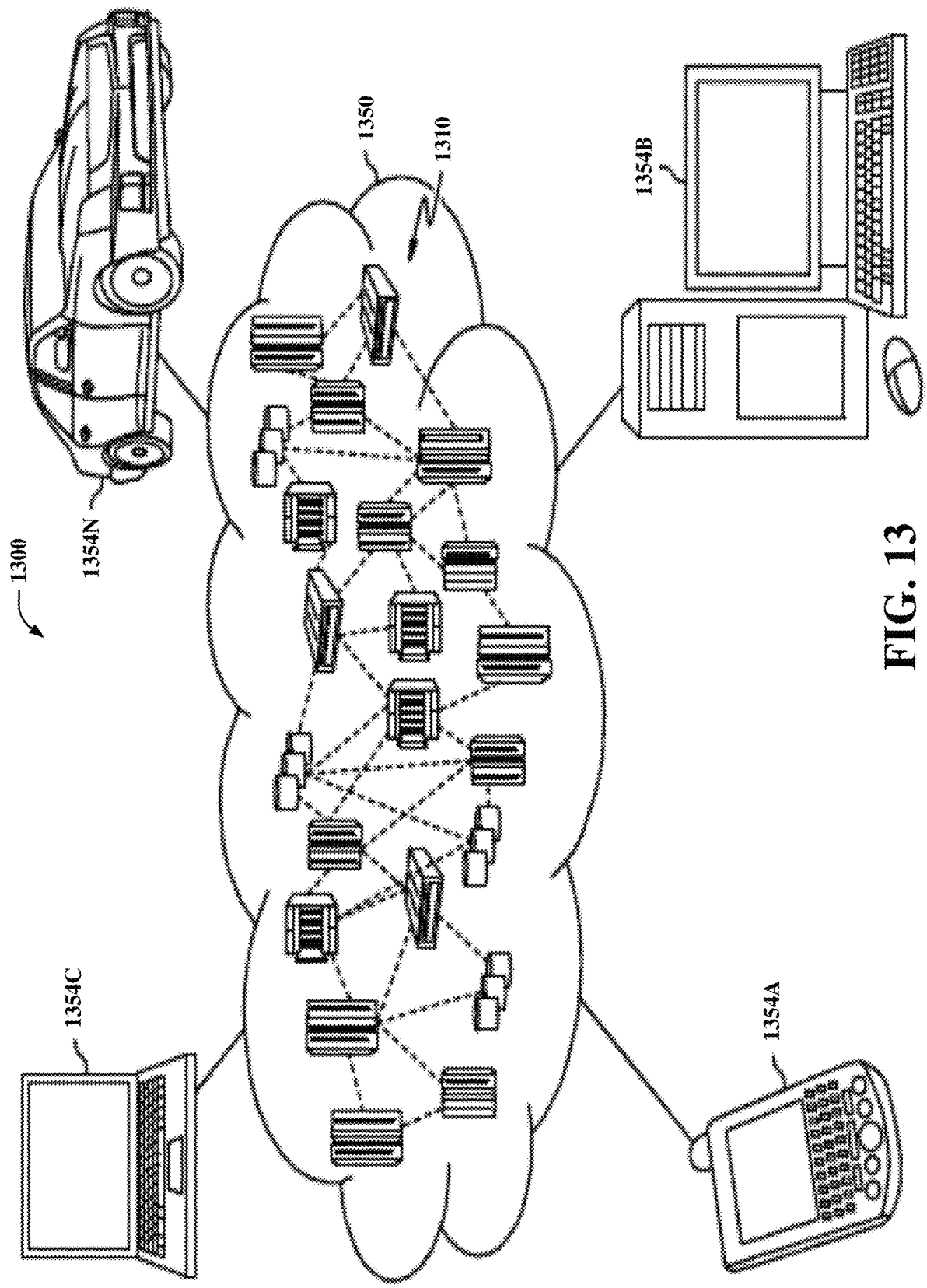
FIG. 13 illustrates a block diagram of an example, non-limiting cloud computing environment in accordance with one or more embodiments of the subject disclosure.

Referring now to FIG. 13, an illustrative cloud computing environment 1350 is depicted. As shown, cloud computing environment 1350 includes one or more cloud computing nodes 1310 with which local computing devices used by cloud consumers, such as, for example, personal digital assistant (PDA) or cellular telephone 1354A, desktop computer 1354B, laptop computer 1354C, and/or automobile computer system 1354N may communicate. Although not illustrated in FIG. 13, cloud computing nodes 1310 can further comprise a quantum platform (e.g., quantum computer, quantum hardware, quantum software, and/or another quantum platform) with which local computing devices used by cloud consumers can communicate. Nodes 1310 may communicate with one another. They may be grouped (not shown) physically or virtually, in one or more networks, such as Private, Community, Public, or Hybrid clouds as described hereinabove, or a combination thereof. This allows cloud computing environment 1350 to offer infrastructure, platforms and/or software as services for which a cloud consumer does not need to maintain resources on a local computing device. It is understood that the types of computing devices 1354A-N shown in FIG. 13 are intended to be illustrative only and that computing nodes 1310 and cloud computing environment 1350 can communicate with any type of computerized device over any type of network and/or network addressable connection (e.g., using a web browser).

Figure 14:
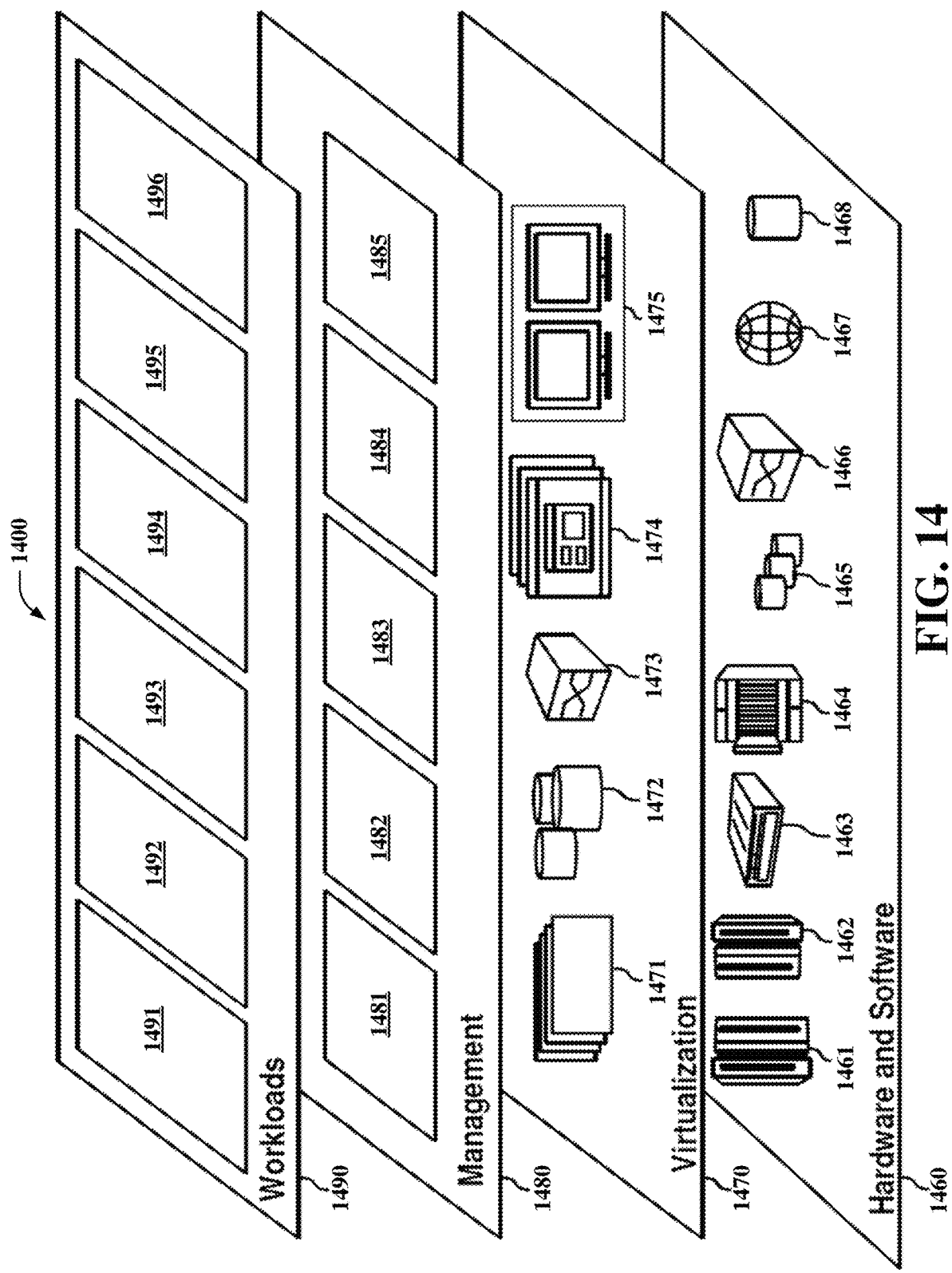
FIG. 14 illustrates a block diagram of example, non-limiting abstraction model layers in accordance with one or more embodiments of the subject disclosure.

Referring now to FIG. 14, a set of functional abstraction layers provided by cloud computing environment 1350 (FIG. 13) is shown. It should be understood in advance that the components, layers, and functions shown in FIG. 14 are intended to be illustrative only and embodiments of the invention are not limited thereto. As depicted, the following layers and corresponding functions are provided:

Hardware and software layer 1460 includes hardware and software components. Examples of hardware components include mainframes 1461; RISC (Reduced Instruction Set Computer) architecture based servers 1462; servers 1463; blade servers 1464; storage devices 1465; and networks and networking components 1466. In some embodiments, software components include network application server software 1467, database software 1468, quantum platform routing software (not illustrated in FIG. 14), and/or quantum software (not illustrated in FIG. 14).

Virtualization layer 1470 provides an abstraction layer from which the following examples of virtual entities may be provided: virtual servers 1471; virtual storage 1472; virtual networks 1473, including virtual private networks; virtual applications and operating systems 1474; and virtual clients 1475.

In one example, management layer 1480 may provide the functions described below. Resource provisioning 1481 provides dynamic procurement of computing resources and other resources that are utilized to perform tasks within the cloud computing environment. Metering and Pricing 1482 provide cost tracking as resources are utilized within the cloud computing environment, and billing or invoicing for consumption of these resources. In one example, these resources may include application software licenses. Security provides identity verification for cloud consumers and tasks, as well as protection for data and other resources. User portal 1483 provides access to the cloud computing environment for consumers and system administrators. Service level management 1484 provides cloud computing resource allocation and management such that required service levels are met. Service Level Agreement (SLA) planning and fulfillment 1485 provide pre-arrangement for, and procurement of, cloud computing resources for which a future requirement is anticipated in accordance with an SLA.

Workloads layer 1490 provides examples of functionality for which the cloud computing environment may be utilized. Non-limiting examples of workloads and functions which may be provided from this layer include: mapping and navigation 1491; software development and lifecycle management 1492; virtual classroom education delivery 1493; data analytics processing 1494; transaction processing 1495; and batched quantum circuits simulation software 1496.

The present invention may be a system, a method, an apparatus and/or a computer program product at any possible technical detail level of integration. The computer program product can include a computer readable storage medium (or media) having computer readable program instructions thereon for causing a processor to carry out aspects of the present invention. The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium can also include the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device. Computer readable program instructions for carrying out operations of the present invention can be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions. These computer readable program instructions can be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks. The computer readable program instructions can also be loaded onto a computer, other programmable data processing apparatus, or other device to cause a series of operational acts to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams can represent a module, segment, or portion of instructions, which comprises one or more executable instructions for implementing the specified logical function(s). In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the subject matter has been described above in the general context of computer-executable instructions of a computer program product that runs on a computer and/or computers, those skilled in the art will recognize that this disclosure also can or can be implemented in combination with other program modules. Generally, program modules include routines, programs, components, data structures, and/or other program modules that perform particular tasks and/or implement particular abstract data types. Moreover, those skilled in the art will appreciate that the inventive computer-implemented methods can be practiced with other computer system configurations, including single-processor or multiprocessor computer systems, mini-computing devices, mainframe computers, as well as computers, hand-held computing devices (e.g., PDA, phone), microprocessor-based or programmable consumer or industrial electronics, and the like. The illustrated aspects can also be practiced in distributed computing environments in which tasks are performed by remote processing devices that are linked through a communications network. However, some, if not all aspects of this disclosure can be practiced on stand-alone computers. In a distributed computing environment, program modules can be located in both local and remote memory storage devices. For example, in one or more embodiments, computer executable components can be executed from memory that can include or be comprised of one or more distributed memory units. As used herein, the term "memory" and "memory unit" are interchangeable. Further, one or more embodiments described herein can execute code of the computer executable components in a distributed manner, e.g., multiple processors combining or working cooperatively to execute code from one or more distributed memory units. As used herein, the term "memory" can encompass a single memory or memory unit at one location or multiple memories or memory units at one or more locations.

As used in this application, the terms "component," "system," "platform," "interface," and the like, can refer to and/or can include a computer-related entity or an entity related to an operational machine with one or more specific functionalities. The entities disclosed herein can be either hardware, a combination of hardware and software, software, or software in execution. For example, a component can be, but is not limited to being, a process running on a processor, a processor, an object, an executable, a thread of execution, a program, and/or a computer. By way of illustration, both an application running on a server and the server can be a component. One or more components can reside within a process and/or thread of execution and a component can be localized on one computer and/or distributed between two or more computers. In another example, respective components can execute from various computer readable media having various data structures stored thereon. The components can communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor. In such a case, the processor can be internal or external to the apparatus and can execute at least a part of the software or firmware application. As yet another example, a component can be an apparatus that provides specific functionality through electronic components without mechanical parts, wherein the electronic components can include a processor or other means to execute software or firmware that confers at least in part the functionality of the electronic components. In an aspect, a component can emulate an electronic component via a virtual machine, e.g., within a cloud computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

As it is employed in the subject specification, the term "processor" can refer to substantially any computing processing unit or device comprising, but not limited to, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Further, processors can exploit nano-scale architectures such as, but not limited to, molecular and quantum-dot based transistors, switches and gates, in order to optimize space usage or enhance performance of user equipment. A processor can also be implemented as a combination of computing processing units. In this disclosure, terms such as "store," "storage," "data store," data storage," "database," and substantially any other information storage component relevant to operation and functionality of a component are utilized to refer to "memory components," entities embodied in a "memory," or components comprising a memory. It is to be appreciated that memory and/or memory components described herein can be either volatile memory or nonvolatile memory, or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), flash memory, or non-volatile random access memory (RAM) (e.g., ferroelectric RAM (FeRAM). Volatile memory can include RAM, which can act as external cache memory, for example. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM (RDRAM). Additionally, the disclosed memory components of systems or computer-implemented methods herein are intended to include, without being limited to including, these and any other suitable types of memory.

What has been described above include mere examples of systems and computer-implemented methods. It is, of course, not possible to describe every conceivable combination of components or computer-implemented methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A system, comprising:
at least one processor that executes computer executable components stored in a memory, the computer executable components comprising:
a generalization component that generates a first defined matrix representation that generalizes a qubit gate used by a first shot comprising a first kernel overhead and the qubit gate, and that employs a control mask to generate a second defined matrix representation that generalizes a multi-qubit gate used by a second shot comprising a second kernel overhead and the multi-qubit gate;
an execution component that executes a kernel overhead operation using the first defined matrix representation and the second defined matrix representation to generate a batched kernel configured to replace the first kernel overhead and the second kernel overhead, wherein the batched kernel is generated from the first defined matrix representation and the second defined matrix representation; and
a simulation component that uses the batched kernel to simulate multiple qubit gates, comprising the qubit gate and the multi-qubit gate, as a single shot.

2. The system of claim 1, wherein the generalization component and the execution component are executed by a first processor of the at least one processor and the simulation component is executed by a second processor of the at least one processor, and wherein the simulation component simulates the qubit gate and the multi-qubit gate using the batched kernel and parallel processing threads, the second processor having at least one of a greater number of cores or a larger memory bandwidth than the first processor.

3. The system of claim 1, wherein the generalization component and the execution component are executed by a first processor of the at least one processor and the simulation component is executed by a second processor of the at least one processor, and wherein the simulation component simulates the qubit gate and the multi-qubit gate using the batched kernel, a batched measure, and parallel processing threads, and wherein the batched measure accumulates probability measurements associated with concurrent simulation of the qubit gate and the multi-qubit gate, the second processor having at least one of a greater number of cores or a larger memory bandwidth than the first processor.

4. The system of claim 1, wherein the generalization component generates at least one of the first defined matrix representation or the second defined matrix representation by multiplying a defined complex matrix by pairs of two probability amplitudes of a statevector of a shot that is indicative of an execution instance of an algorithm representing a quantum circuit.

5. The system of claim 1, wherein the multi-qubit gate comprises a control qubit, and wherein the generalization component generates the second defined matrix representation by multiplying a defined complex matrix by pairs of two probability amplitudes having defined criteria, and wherein the pairs of two probability amplitudes are of a statevector of a shot that is indicative of an execution instance of an algorithm representing a quantum circuit.

6. The system of claim 1, wherein the computer executable components further comprise:
a storage component that causes to be stored, in multiple queues, parameters to concurrently simulate the qubit gate and the multi-qubit gate on a second processor, the second processor having at least one of a greater number of cores or a larger memory bandwidth than the first processor, and wherein the parameters are selected from a group consisting of the first defined matrix representation, the second defined matrix representation, pointers to statevectors, control masks, target qubits, and second target qubits.

7. The system of claim 1, wherein the execution component executes the kernel overhead operation using the first defined matrix representation and the second defined matrix representation to generate the batched kernel and to reduce computational cost associated with at least one of execution of the kernel overhead operation or concurrent simulation of the qubit gate and the multi-qubit gate on a second processor, the second processor having at least one of a greater number of cores or a larger memory bandwidth than the first processor.

8. A computer-implemented method, comprising:
generating, by a system operatively coupled to at least one processor, a first defined matrix representation that generalizes a qubit gate configured to be simulated with a first kernel overhead;
employing, by the system, a control mask to generate a second defined matrix representation that generalizes a multi-qubit gate configured to be simulated with a second kernel overhead;
executing, by the system, a kernel overhead operation using the first defined matrix representation and the second defined matrix representation to generate a batched kernel configured to replace the first kernel overhead and the second kernel overhead; and
using, by the system, the batched kernel to simulate multiple qubit gates as a single shot, the multiple qubit gates comprising the qubit gate and the multi-qubit gate.

9. The computer-implemented method of claim 8, further comprising:
simulating, by the system, concurrently, the qubit gate and the multi-qubit gate on a different processor of the at least one processor than the generating, the different processor having at least one of a greater number of cores or a larger memory bandwidth than the first processor, using the batched kernel and parallel processing threads.

10. The computer-implemented method of claim 8, further comprising:
simulating, by the system, concurrently, the qubit gate and the multi-qubit gate on a different processor of the at least one processor than the generating, the different processor having at least one of a greater number of cores or a larger memory bandwidth than the first processor, using the batched kernel, a batched measure, and parallel processing threads, wherein the batched measure accumulates probability measurements associated with concurrent simulation of the qubit gate and the multi-qubit gate.

11. The computer-implemented method of claim 8, further comprising:
generating, by the system, at least one of the first defined matrix representation or the second defined matrix representation by multiplying a defined complex matrix by pairs of two probability amplitudes of a statevector of a shot that is indicative of an execution instance of an algorithm representing a quantum circuit.

12. The computer-implemented method of claim 8, wherein the multi-qubit gate comprises a control qubit, and further comprising:
generating, by the system, the second defined matrix representation by multiplying a defined complex matrix by pairs of two probability amplitudes having defined criteria, and wherein the pairs of two probability amplitudes are of a statevector of a shot that is indicative of an execution instance of an algorithm representing a quantum circuit.

13. The computer-implemented method of claim 8, further comprising:
storing, by the system, in multiple queues, parameters to concurrently simulate the qubit gate and the multi-qubit gate on a second processor, the second processor having at least one of a greater number of cores or a larger memory bandwidth than the first processor, wherein the parameters are selected from a group consisting of the first defined matrix representation, the second defined matrix representation, pointers to statevectors, control masks, target qubits, and second target qubits.

14. The computer-implemented method of claim 8, further comprising:
executing, by the system, the kernel overhead operation using the first defined matrix representation and the second defined matrix representation to generate the batched kernel and to reduce computational cost associated with at least one of execution of the kernel overhead operation or concurrent simulation of the qubit gate and the multi-qubit gate on a second processor, the second processor having at least one of a greater number of cores or a larger memory bandwidth than the first processor.

15. A computer program product comprising a computer readable storage medium having program instructions embodied therewith, the program instructions executable by at least one processor to cause the at least one processor to:
generate a first defined matrix representation that generalizes a qubit gate configured to be simulated with a first kernel overhead;
employ a control mask to generate a second defined matrix representation that generalizes a multi-qubit gate configured to be simulated with a second kernel overhead;
execute a kernel overhead operation using the first defined matrix representation and the second defined matrix representation to generate a batched kernel configured to replace the first kernel overhead and the second kernel overhead; and
utilize the batched kernel to simulate multiple qubit gates as a single shot, the multiple qubit gates comprising the qubit gate and the multi-qubit gate.

16. The computer program product of claim 15, comprising program instructions executable by a second processor of the at least one processor, different than a first processor used to generate the first defined matrix, the second processor having at least one of a greater number of cores or a larger memory bandwidth than the first processor, to cause the second processor to:
simulate, concurrently, the qubit gate and the multi-qubit gate using the batched kernel and parallel processing threads.

17. The computer program product of claim 15, comprising program instructions executable by a second processor of the at least one processor, different than a first processor used to generate the first defined matrix, the second processor having at least one of a greater number of cores or a larger memory bandwidth than the first processor, to cause the second processor to:
simulate, concurrently, the qubit gate and the multi-qubit gate using the batched kernel, a batched measure, and parallel processing threads, wherein the batched measure accumulates probability measurements associated with concurrent simulation of the qubit gate and the multi-qubit gate.

18. The computer program product of claim 15, comprising program instructions executable by the at least one processor to cause the at least one processor to:
generate at least one of the first defined matrix representation or the second defined matrix representation by multiplying a defined complex matrix by pairs of two probability amplitudes of a statevector of a shot that is indicative of an execution instance of an algorithm representing a quantum circuit.

19. The computer program product of claim 15, wherein the multi-qubit gate comprises a control qubit, and wherein the program instructions are further executable by the at least one processor to cause the at least one processor to:
generate the second defined matrix representation by multiplying a defined complex matrix by pairs of two probability amplitudes having defined criteria, and wherein the pairs of two probability amplitudes are of a statevector of a shot that is indicative of an execution instance of an algorithm representing a quantum circuit.

20. The computer program product of claim 15, wherein the program instructions are further executable by the at least one processor to cause the at least one processor to:
store, in multiple queues, parameters to concurrently simulate the qubit gate and the multi-qubit gate on a second processor, the second processor having at least one of a greater number of cores or a larger memory bandwidth than the first processor, and wherein the parameters are selected from a group consisting of the first defined matrix representation, the second defined matrix representation, pointers to statevectors, control masks, target qubits, and second target qubits.

* * * * *